United States Patent [19]

Leffmann

[11] 4,284,956
[45] Aug. 18, 1981

[54] WIDE DYNAMIC RANGE PULSE TO PULSE RATE CONVERTER

[75] Inventor: (Paul) Harry Leffmann, Scottsdale, Ariz.

[73] Assignee: Motorola Inc., Schaumburg, Ill.

[21] Appl. No.: 36,897

[22] Filed: May 7, 1979

[51] Int. Cl.³ .......................... H03K 13/02; H03K 9/06
[52] U.S. Cl. ...................................... 328/140; 307/519
[58] Field of Search ............................. 328/138, 140; 307/233 A, 233 B, 233 R

[56] References Cited

U.S. PATENT DOCUMENTS

| | | | |
|---|---|---|---|
| 3,076,940 | 2/1963 | Davis et al. | 307/233 X |
| 3,605,029 | 9/1971 | Freedman | 307/233 X |
| 3,782,784 | 1/1974 | Marouby | 328/140 X |

Primary Examiner—John S. Heyman

[57] ABSTRACT

A system for converting a variable pulse rate input signal to an analog output signal responsive to the rate of the input. A plurality of parallel channels are utilized in the conversion process, each covering a different portion of the desired dynamic range of the system, with the outputs superpositioned in a weighted fashion for producing a combined output.

2 Claims, 1 Drawing Figure

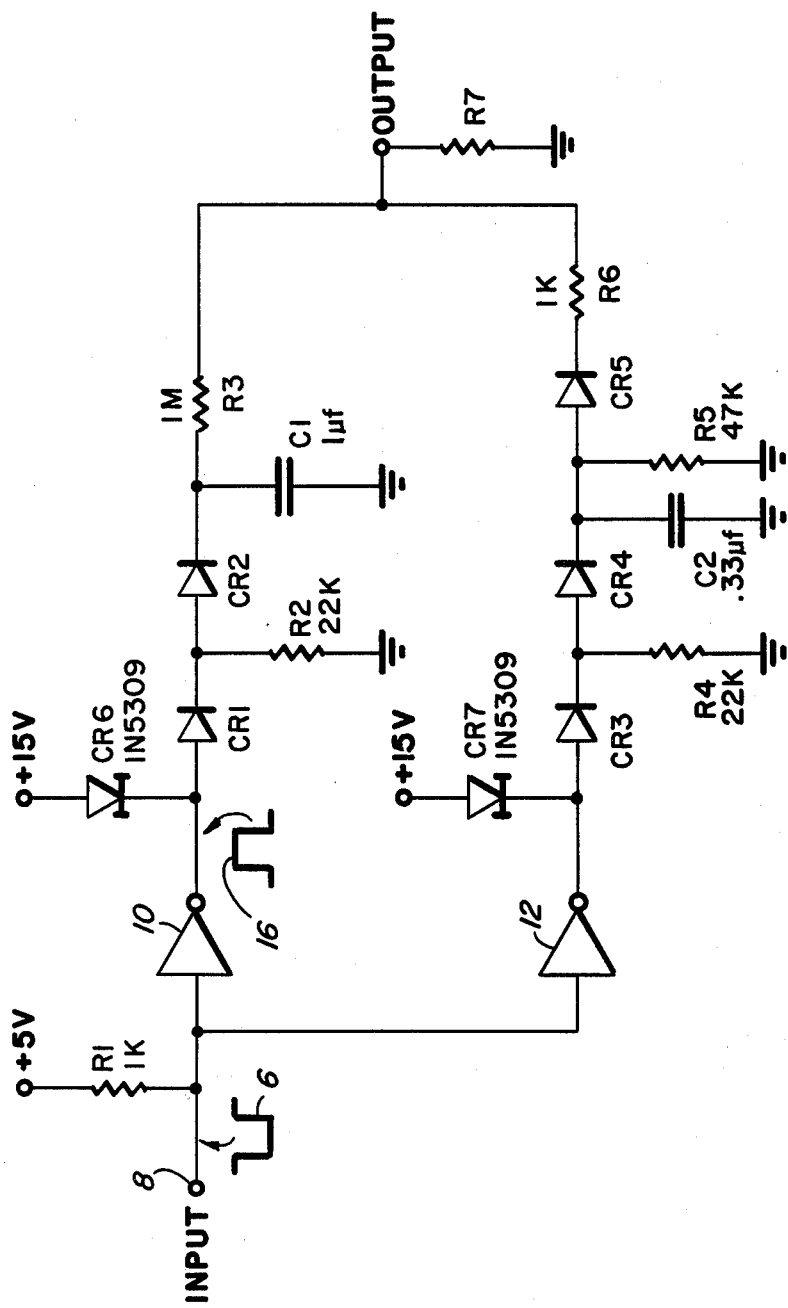

WIDE DYNAMIC RANGE PULSE TO PULSE RATE CONVERTER

FIELD OF THE INVENTION

The invention relates to an improved dynamic range pulse rate to analog converter for automatic conversion of random digital input events to analog rate information.

BACKGROUND OF THE INVENTION

It is advantageous, in some applications, to measure and display in human readable form an input pulse rate. An example of the need for such a requirement is in data transmission systems where bit error rate information may be of value in the operation of the system. In such systems, the pulse rate may vary over very wide ranges and prior art circuits, such as those taught by Bauer in U.S. Pat. No. 3,601,707, Sange in U.S. Pat. No. 3,197,701 and Hinckley in U.S. Pat. No. 4,075,513 may not have sufficient dynamic range to satisfy the requirement.

SUMMARY OF THE INVENTION

These and other shortcomings and problems in prior art circuits are resolved in the present invention by means of a plural channel pulse rate to analog voltage conversion system wherein the input signal is fed simultaneously to at least two parallel converters of different pulse rate range sensitivity. The outputs of the multiple parallel channels are recombined or superpositioned in a resistor network providing suitable weight to each input. Dynamic ranges of as much as $10^4:1$ have been demonstrated.

It is therefore an object of the invention to provide an improved dynamic input range for a pulse rate to analog converter.

It is another object of the invention to provide improved dynamic input range for a pulse rate to analog converter by utilizing a plurality of converter circuits, each of which covers a portion of the desired dynamic range and to recombine each of the outputs of the plurality of converters in a summing circuit which assigns a suitable weighting factor to each of the recombined analog signals.

These and other objects of the instant invention will be more clearly understood upon study of the Detailed Description of the Invention which follows, and the drawing in which a schematic diagram of the preferred embodiment of the invention is illustrated.

DETAILED DESCRIPTION OF THE INVENTION

Referring to the drawing, variable rate pulse signal 6 is fed to input terminal 8. Terminal 8 is connected to one end of 1K resistor R1, and the inputs of inverting gates 10 and 12. The other end of resistor R1 is connected to a positive power source, +5 V. The output of gate 10 is connected to the cathode of current regulating diode CR6 and to the anode of diode CR1. The anode of diode CR6 is connected to a positive power source, +15 V. The cathode of diode CR1 is connected to one end of 22K resistor R2 and to the anode of diode CR2. The other end of resistor R2 is grounded. The cathode of diode CR2 is connected to one end of 1M resistor R3 and to one end of 1 µf capacitor C1. The other end of capacitor C1 is grounded and the other end of resistor R3 is connected to load resistor R7 which goes to ground.

Gate 12 output is connected to the cathode of current regulating diode CR7 and the anode of diode CR3. The anode of diode CR7 is connected to positive power source, +15 V. The cathode of diode CR3 is connected to 22K resistor R4, which is grounded, and to the anode of diode CR4. The cathode of diode CR4 is connected to 0.33 µf capacitor C2 and to 47K resistor R5, which are both grounded, and to the anode of diode CR5. The cathode of diode CR5 is connected to load resistor R7 which is grounded through 1K resistor, R6.

Still referring to the drawing, open collector gates 10, 12 which may be TTL type 7416 circuits, invert and buffer input signal 6. These circuits are readily available from the industry. Current regulator diodes CR6 and CR7, which may be 1N5309's, provide a 3 milliampere constant current at the junction of the open collector gate 10 and diode CR1, and gate 12 and diode CR3, respectively. With gate 10 in the "OFF" or high output state 16, the current of diode CR6 is supplied, through diodes CR1 and CR2, to capacitor C1. This current is discharged from capacitor C1 through resistor R3, which in turn is connected to low impedance load resistor R7.

The time constant for the discharge of C1 is $C1 \times R3 = 1 \times 10^{-6} \times 1 \times 10^6$, or one second, in the preferred embodiment of the invention as shown in the drawing. (Of course, this time constant may be made any convenient value according to design considerations for a particular application of the invention.) Input pulses 6 are averaged by means of this time constant.

Diodes CR1, CR2, and resistor R2 serve to reduce the current which flows through diode CR1 to a negligible value when gate 10 is "ON" ("0"). The typical value of "ON" voltage at the output of gate 10 is 0.2 V (at 3 MA) and the small current leakage of diode CR1, at a forward bias of 0.2 V, is shunted to ground by resistor R2. The current leakage of diode CR2 with only a few millivolts of forward voltage (the voltage produced by the current of diode CR1 times the value of resistor R2) is less than 0.5 nanoampere.

The circuit just described produces relatively large output voltages at very low input pulse rates. This reduces the error component introduced by voltage offsets in any current sensing device (not shown) used at the output across resistor R7. At a duty cycle (based on a 1 µsec input pulse width) of 1 pulse per minute, the current into capacitor C1 is $3 \text{ MA} \times 10^{-6} = 3 \times 10^{-9}$ amp. The output voltage (open circuit) across resistor R3 is $3 \times 10^{-9} \times 10^6 = 3$ mV. (For larger open circuit voltage resistor R3 may be increased. At R3 = 10 meg ohms and $10^{-6}$ duty cycle, output is $3 \times 10^{-9}$ amp, which does not change, to yield an open circuit voltage of 30 mV.)

Current regulator diodes CR6 and CR7 require a minimum of 3 volts for proper operation. Therefore, the circuit saturates at an output current of about 12 µa (12 µa × 1 meg is 12 volts) and covers a range of $10^4:1$; $10^{-9}$ amp to approximately $10^{-5}$ amperes.

At $10^{-5}$ amperes the duty cycle (again, based on an input pulse width of 1 µsec) of the input is:

$$\frac{10^{-5} \text{ (output)}}{3 \times 10^{-3} \text{ (charging)}} = 3.3 \times 10^{-3}$$

The circuit of diodes CR7, CR3, CR4, CR5 and associated components extends the dynamic range by a factor of several hundred.

Diode CR3, resistor R4 and diode CR4 are identical physically and in function to diode CR1, resistor R2 and diode CR2. Resistor R5 shunts the output current of diode CR4 to ground until that current produces a voltage of $I_{CR4} \times R5$ which forward biases diode CR5 into conduction. This circuit is designed so that diode CR5 starts to conduct current near the saturation duty cycle of the circuit which includes diodes CR1, CR2, and CR6.

This provides a transfer of function from a low current pulse-to-current converter (which has relatively high voltage output) to a converter which has lower voltage sensitivity and an operating range up to 100% duty cycle. The output filtering of this circuit is capacitor C2 and resistor R6 and may be of a shorter time constant (since this part of the circuit responds to higher pulse rates than capacitor C1 and resistor R3) for optimum human interface.

The two current outputs (from resistors R3 and R6) are summed together and interact in resistor R7 by superposition. Resistor R7 represents the input impedance of a driven circuit (not shown). The signal on resistor R7 may drive a log amplifier whose output will display bit error rate over 6 decades of dynamic range.

While the example, above, is based on input pulses having a 1 $\mu$sec pulse width, this is clearly a designer's choice. Other pulse widths may be used as long as the output circuit, or some other portion of the system, is calibrated for the resulting duty cycle effects. This is only important, of course, when quantitative results are desired. Where relative outputs will suffice, no calibration is necessary.

It will also be apparent to one of average skill in the art that more than two converter channels may be employed and combined or superpositioned to yield greater accuracy and/or still more dynamic range.

While the invention has been particularly shown and described with reference to a preferred embodiment thereof, it will be understood by those skilled in the art that various other modifications and changes may be made to the present invention from the principles of the invention described above without departing from the spirit and scope thereof, as encompassed in the accompanying claims. Therefore, it is intended in the appended claims to cover all such equivalent variations as come within the scope of the invention as described.

I claim:

1. A wide dynamic range pulse to pulse rate converter comprising in combination:
    first means for linearly converting an input pulse rate to a first linear analog output;
    second means for linearly converting said input pulse rate to a second linear analog output; and
    means for superpositioning said first and second analog outputs.

2. A wide dynamic range pulse to pulse rate converter comprising in combination:
    a plurality of means for linearly converting a variable input pulse rate to a like plurality of linear analog outputs, each of said plurality of converting means being adapted to cover a different portion of a required dynamic range of input rates; and
    means for superpositioning said plurality of linear analog outputs to provide the required wide dynamic range.

* * * * *